United States Patent [19]

Lamb

[11] Patent Number: 4,890,067
[45] Date of Patent: Dec. 26, 1989

[54] COMMON BASE CONFIGURATION FOR AN $F_T$ DOUBLER AMPLIFIER

[75] Inventor: James S. Lamb, Portland, Oreg.
[73] Assignee: Tektronix, Inc., Beaverton, Oreg.
[21] Appl. No.: 337,677
[22] Filed: Apr. 13, 1989
[51] Int. Cl.⁴ .............................................. H03F 3/45
[52] U.S. Cl. .................................... 330/149; 330/252; 330/311
[58] Field of Search ........................ 330/149, 252, 311

[56] References Cited

U.S. PATENT DOCUMENTS

3,633,120  1/1972  Batties ................................. 330/271
4,267,516  5/1981  Traa .................................. 330/252 X
4,804,926  2/1989  Woo ................................... 330/149

Primary Examiner—James B. Mullins
Attorney, Agent, or Firm—Peter J. Meza

[57] ABSTRACT

An $f_T$ doubler amplifier having a Darlington type common base stage is provided wherein the fast current contributions from the $f_T$ doubler are passed through the slow path of the Darlington common base stage, and the slow current contributions from the $f_T$ doubler are passed through the fast path of the Darlington common base in order that the delay of each current contribution is more closely matched. In this way, the distributed nature of the amplifier and resultant phase distortion are minimized and transient response is improved.

6 Claims, 5 Drawing Sheets

COMMON BASE CONFIGURATION FOR AN $F_T$ DOUBLER AMPLIFIER

BACKGROUND OF THE INVENTION

This invention relates to differential amplifiers and, more particularly, to $f_T$ doubler amplifiers of the type having a common base stage.

Figure 1A:
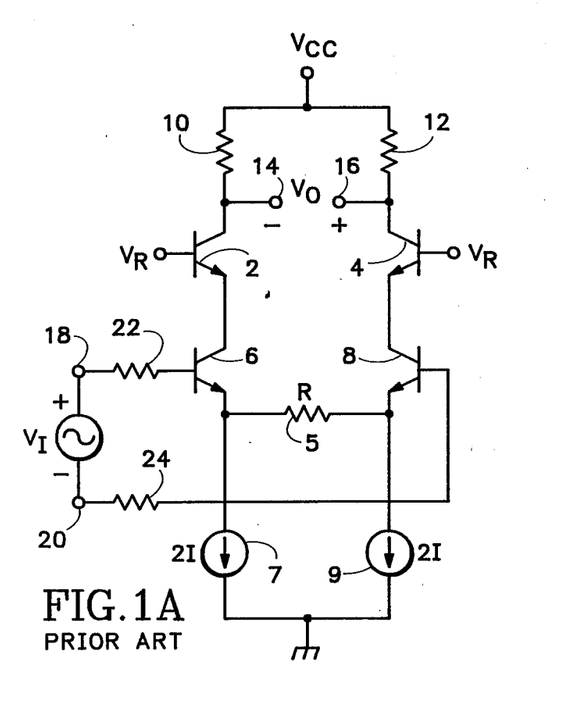
FIG. 1A is a schematic diagram of a prior art differential amplifier including a common base output stage.
Figure 1B:
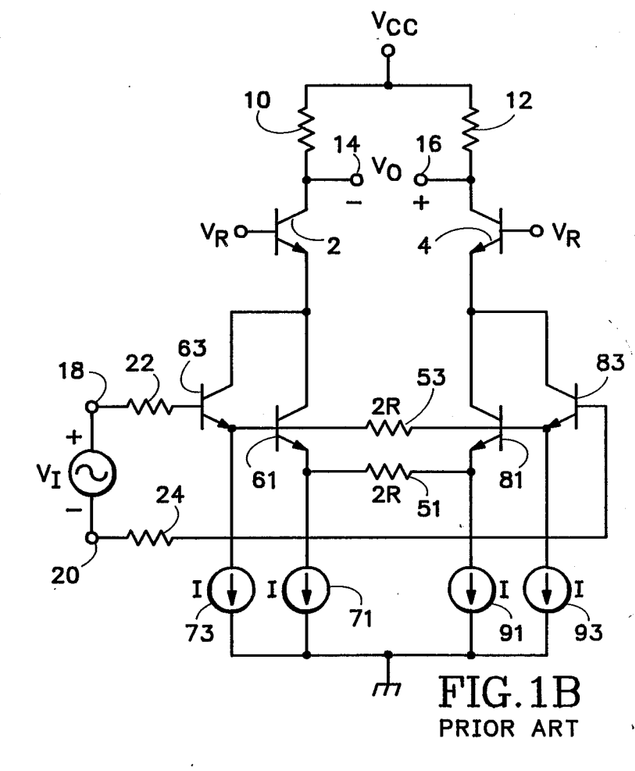
FIG. 1B is a schematic diagram of a prior art Darlington type $f_T$ doubler amplifier including a common base output stage.
Figure 1C:
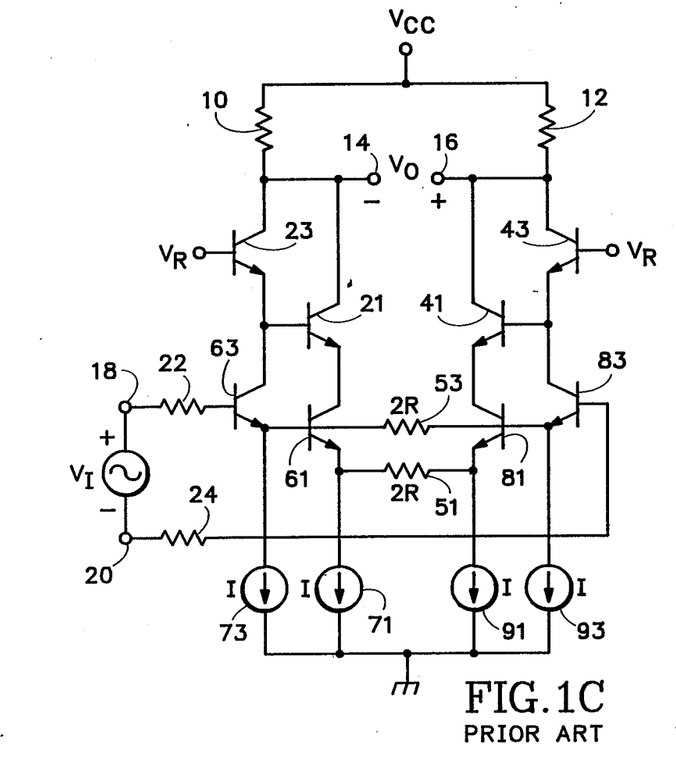
FIG. 1C is a schematic diagram of a prior art Darlington type $f_T$ doubler amplifier including a Darlington common base output stage.

FIGS. 1A through 1C show the evolution of the prior art prior to one embodiment of the present invention. In FIG. 1A, a differential amplifier and common base stage is shown. The amplifier includes transistors 6 and 8 whose emitters are coupled through resistor 5, which has a value of R ohms. The bases of transistors 6 and 8 are respectively coupled to the input terminals 18 and 20 through input resistors 22 and 24. A differential input voltage $V_I$ is coupled between input terminals 18 and 20. Bias current for transistors 6 and 8 is provided by constant current sources 7 and 9, each having a value of 2I milliamps. The common base stage for the amplifier includes transistors 2 and 4, the bases of transistors 2 and 4 being coupled to a source of reference voltage, $V_R$. The differential output current provided by transistors 2 and 4 is converted to a differential output voltage at output terminals 14 and 16 by load resistors 10 and 12 that are coupled to a source of positive voltage, $V_{CC}$.

The amplifier in FIG. 1B, designated as a Darlington type $f_T$ doubler amplifier, has an improved frequency response beyond the amplifier shown in FIG. 1A. Transistors 6 and 8 have been each replaced by two transistors arranged in a Darlington configuration. Transistor 6 has been replaced by transistors 63 and 61 and transistor 8 has been replaced by transistors 83 and 81. Emitter resistor 5 has been replaced by emitter resistors 51 and 53. Resistor 51 has a value of 2R ohms and couples the emitters of transistors 61 and 81. Resistor 53 also has a value of 2R ohms and couples the emitters of transistors 63 and 83, as well as being coupled between the bases of transistors 61 and 81. The bias for transistors 63, 61, 81, and 83 is provided by current sources 73, 71, 91, and 93, respectively. Each current source has a value of 1 milliamps. The remainder of the amplifier in FIG. 1B is identical to the amplifier shown in FIG. 1A.

Since each of the transistors 63, 61, 81, and 83 operate at half the current of transistors 6 and 8 of the amplifier shown in FIG. 1A and because resistors 51 and 53 are twice the value of resistor 5, the input capacitance is lowered by approximately a factor of two. However, the total gain of the amplifier is the same as the amplifier of FIG. 1A. (One half the gain attributed to transistors 63 and 83, and one half the gain attributed to transistors 61 and 81). Assuming that the bandwidth of the amplifier is limited by the input circuit, the reduction of the input capacitance by a factor of two coupled with the same overall amplifier gain results in an improvement in frequency response by approximately a factor of two. Additionally, the input bias current seen at input terminals 18 and 20 is reduced by a factor of two as well as the variation in input bias current with transistor beta.

The amplifier in FIG. 1C is also a Darlington type $f_T$ doubler amplifier and has an improved common base stage over the amplifier shown in FIGS. 1A-B. Transistors 2 and 4 have been each replaced by two transistors arranged in a Darlington configuration. Transistor 2 has been replaced by transistors 23 and 21 and transistor 4 has been replaced by transistors 43 and 41. The addition of the Darlington common base stage significantly reduces base current losses through transistors 2 and 4. The remainder of the amplifier shown in FIG. 1C is identical to the amplifier shown in FIG. 1B.

Figure 3A:
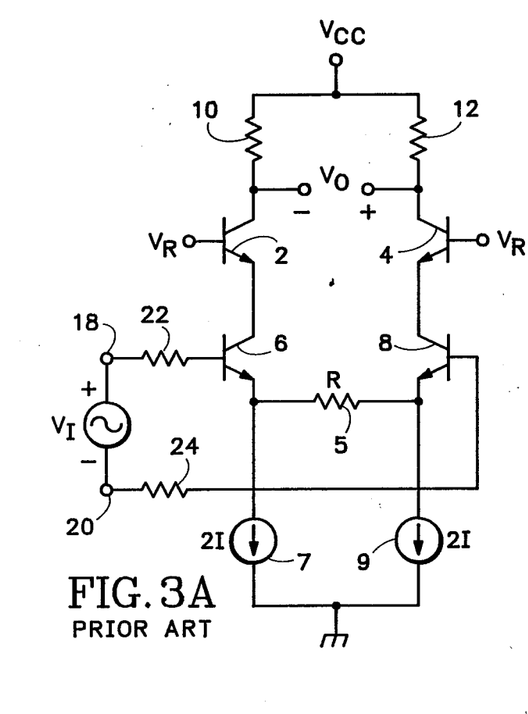
FIG. 3A is a schematic diagram of a prior art differential amplifier including a common base output stage.
Figure 3B:
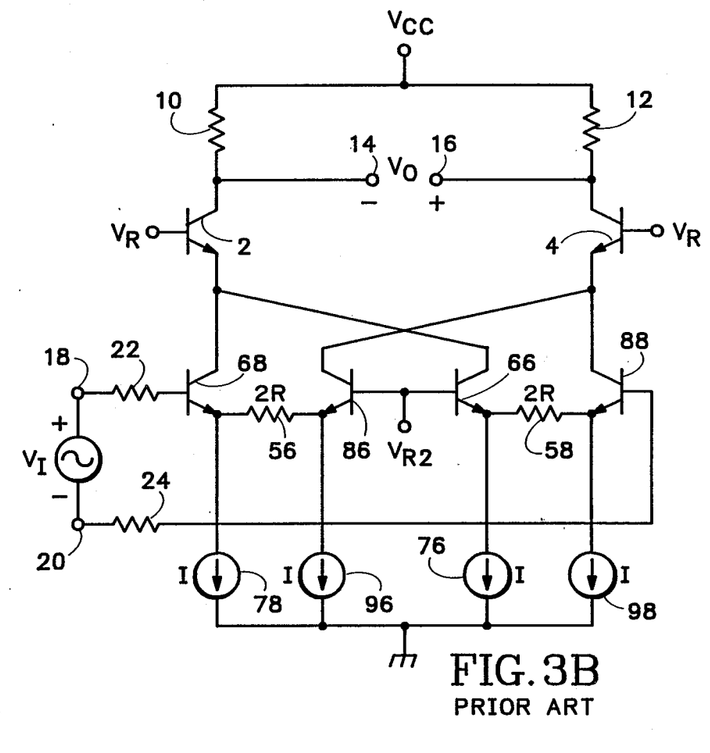
FIG. 3B is a schematic diagram of a prior art series input-parallel output type $f_T$ doubler amplifier including a common base output stage.
Figure 3C:
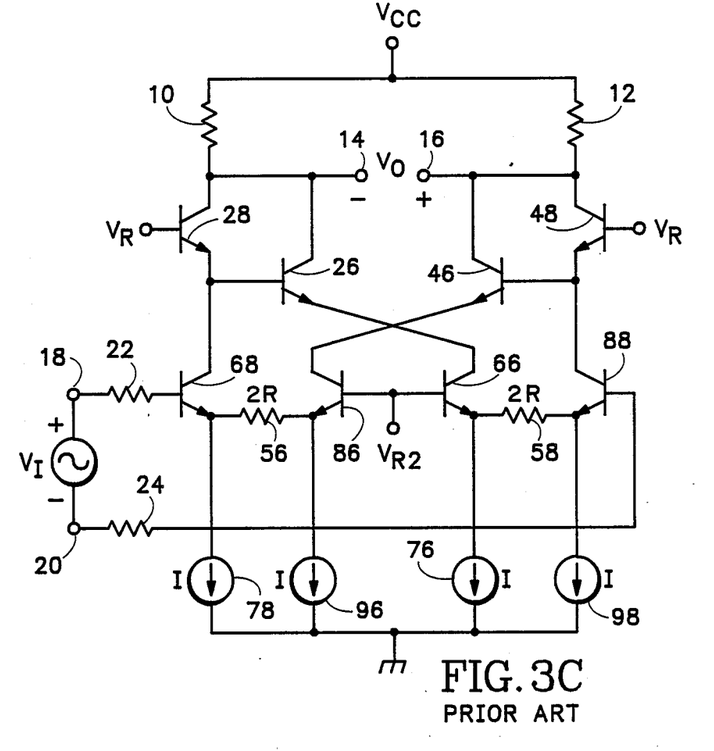
FIG. 3C is a schematic diagram of a prior art series input-parallel output type $f_T$ doubler amplifier including a Darlington common base output stage.

FIGS. 3A through 3C show the evolution of the prior art up to another embodiment of the present invention. FIG. 3A is identical to FIG. 1A and is reproduced to help illustrate the evolution of the other embodiment.

The amplifier in FIG. 3B, designated as a series input-parallel output type $f_T$ doubler amplifier, has an improved frequency response beyond the amplifier shown in FIG. 3A. The circuit in FIG. 3B was invented by Carl Battjes and is explained in detail in U.S. Pat. No. 3,633,120 entitled "Amplifier Circuit" that is herein incorporated by reference. Transistors 6 and 8 have been each replaced by two differential pairs coupled to $V_{R2}$, a source of reference voltage. Transistor 6 has been replaced by transistors 66 and 68 and transistor 8 has been replaced by transistors 86 and 88. Emitter resistor 5 has been replaced by emitter resistors 56 and 58. Resistor 56 has a value of 2R ohms and couples the emitters of transistors 68 and 86. Resistor 58 also has a value of 2R ohms and couples the emitters of transistors 66 and 88. The bias for transistors 68, 86, 66, and 88 is provided by current sources 78, 96, 76, and 98, respectively. Each current source has a value of 1 milliamps. The remainder of the amplifier in FIG. 3B is identical to the amplifier shown in FIG. 3A.

The analysis of the frequency response of the $f_T$ doubler shown in FIG. 3B is identical to that of the $f_T$ doubler shown in FIG. 1B. Each of the transistors 68, 86, 66, and 88 operate at half the current and are emitter coupled to twice the emitter resistance of transistors 6 and 8 of the amplifier shown in FIG. 3A. Therefore the input capacitance is lowered by approximately a factor of two. The total gain of the amplifier is the same as the amplifier of FIG. 3A. (One half the gain attributed to transistors 68 and 86, and one half the gain attributed to transistors 66 and 88). Assuming the bandwidth is limited by the input circuit, the reduction of the input capacitance by a factor of two coupled with the same overall amplifier gain results in an improvement in frequency response by approximately a factor of two. Additionally, the input bias current seen at input terminals 18 and 20 is reduced by a factor of two as well the variation in input bias current with transistor beta.

The amplifier in FIG. 3C is also a series input-parallel output type $f_T$ doubler amplifier and has an improved common base stage over the amplifier shown in FIGS. 3A-B. Transistors 2 and 4 have been each replaced by two transistors arranged in a Darlington configuration. Transistor 2 has been replaced by transistors 28 and 26 and transistor 4 has been replaced by transistors 48 and 46. The addition of the Darlington common base stage significantly reduces base current losses through transistors 2 and 4. The remainder of the amplifier shown in FIG. 3C is identical to the amplifier shown in FIG. 3B.

The amplifiers shown in FIGS. 1B-C and FIGS. 3B-C may also be designated as distributed amplifiers in that the total gain is distributed between two amplifier stages. In such amplifiers it is important that individual contributions from each amplifier stage sum in phase and without delay between stages. The Darlington common base stage in FIGS. 1C and 3C do not correctly sum the individual contributions from each amplifier stage. Briefly stated, the problem lies in the distributed nature of the amplifier stages as well as in the Darlington common base stage. Using the amplifier in FIG. 1C as an example, the signal contributions from the stage coupled to the voltage input signal, transistors 63 and 83, are passed through a relatively low delay path (relatively lower delay is referred to subsequently as "fast"), which includes transistors 23 and 43. The signal contributions from the stage including transistors 61 and 81 is delayed due to the finite delay provided by transistors 63 and 83. However, this delayed signal is further delayed by a relatively higher delay path (relatively higher delay is referred to subsequently as "slow"), which includes transistors 21 and 41. The result is that the signal contributions are significantly delayed, one from the other. Therefore, in response to an input voltage pulse, an output voltage pulse is produced at output terminals 10 and 12 that has undesirable transient response due to phase distortion such as overshoot, undershoot, or a combination thereof.

What is desired is an $f_T$ doubler amplifier having a Darlington type common base stage that adjusts the phase of signal contributions at the output to produce an improvement in bandwidth and transient response.

SUMMARY OF THE INVENTION

In accordance with the present invention, an $f_T$ doubler amplifier having a Darlington type common base stage is provided wherein the fast current contributions from the $f_T$ doubler are passed through the slow path of the Darlington common base stage, and the slow current contributions from the $f_T$ doubler are passed through the fast path of the Darlington common base in order that the delays of each current contribution are more closely matched. In this way, the distributed nature of the amplifier and resultant phase distortion are minimized and transient response is improved.

In a first embodiment, the $f_T$ doubler is of the Darlington type. In an alternative first embodiment, the individual amplifier stages are repeated to include three or more stages, the output from each stage being passed through an appropriate common base stage transistor. In a second embodiment, the $f_T$ doubler is of the series input-parallel output type.

DESCRIPTION OF THE PREFERRED EMBODIMENT

For a better understanding of the invention, terms describing the location of the transistors must be defined. Referring to FIG. 1C, the transistors in the differential amplifier stage that are coupled to the input voltage are referred to as the "outer" transistors, with their respective emitters and collectors being referred to as the "outer" emitters and collectors. In FIG. 1C, the outer transistors are transistors 63 and 83. Conversely, the transistors that are not directly coupled to the input voltage are referred to as the "inner" transistors, with their respective emitters and collectors being referred to as the "inner" emitters and collectors. In FIG. 1C, the inner transistors are transistors 61 and 81.

Similarly, the transistors in the Darlington common base stage are labeled with the orientation shown in FIG. 1C. That is to say, the bases of the transistors are facing outward in the same configuration as the differential amplifier stage. Referring to FIG. 1C, the transistors in the Darlington common base stage that are coupled to the reference voltage, $V_R$ are referred to as the "outer" transistors, with their respective emitters and collectors being referred to as the "outer" emitters and collectors. In FIG. 1C, the outer transistors are transistors 23 and 43. Conversely, the transistors that are not directly coupled to the reference voltage are referred to as the "inner" transistors, with their respective emitters and collectors being referred to as the "inner" emitters and collectors. In FIG. 1C, the inner transistors are transistors 21 and 41. Therefore, consistent with this definition, in FIG. 3C transistors 68 and 88 are the outer transistors in the amplifier stage, transistors 86 and 66 are the inner transistors in the amplifier stage, transistors 28 and 48 are the outer transistors in the common base stage, and transistors 26 and 46 are the inner transistors in the common base stage.

Figure 1D:
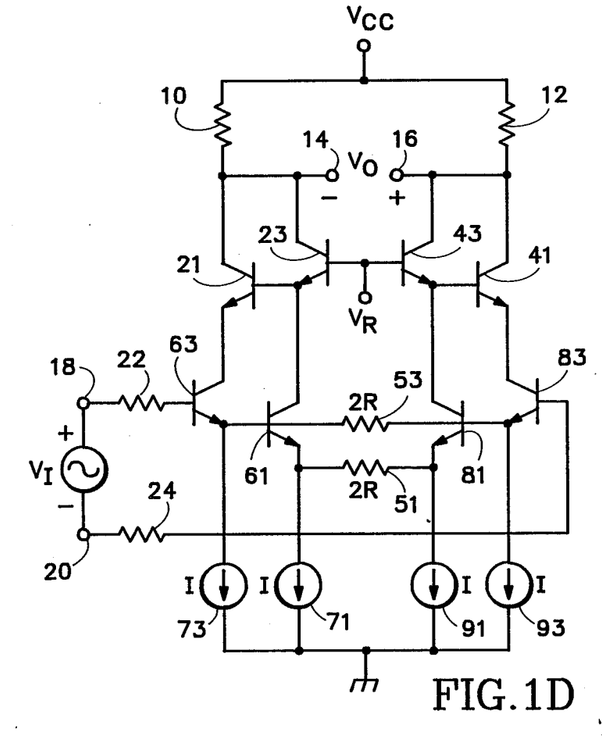
FIG. 1D is a schematic diagram of a first embodiment of an $f_T$ doubler amplifier according to the present invention.

The first embodiment of the present invention is shown in FIG. 1D. The amplifier stage has been described in the Background of the invention and is shown in FIG. 1C. The important difference lies in the configuration of the common base stage. Note that the location of the inner and outer transistors in the common base stage have been reversed. Specifically, transistors 21 and 23 have switched positions with the emitter of transistor 21 now being coupled to the collector of transistor 63 and the emitter of transistor 23 now being coupled to the collector of transistor 61. Similarly, transistors 41 and 43 have switched positions with the emitter of transistor 41 now being coupled to the collector of transistor 83 and the emitter of transistor 43 now being coupled to the collector of transistor 81.

Figure 2:
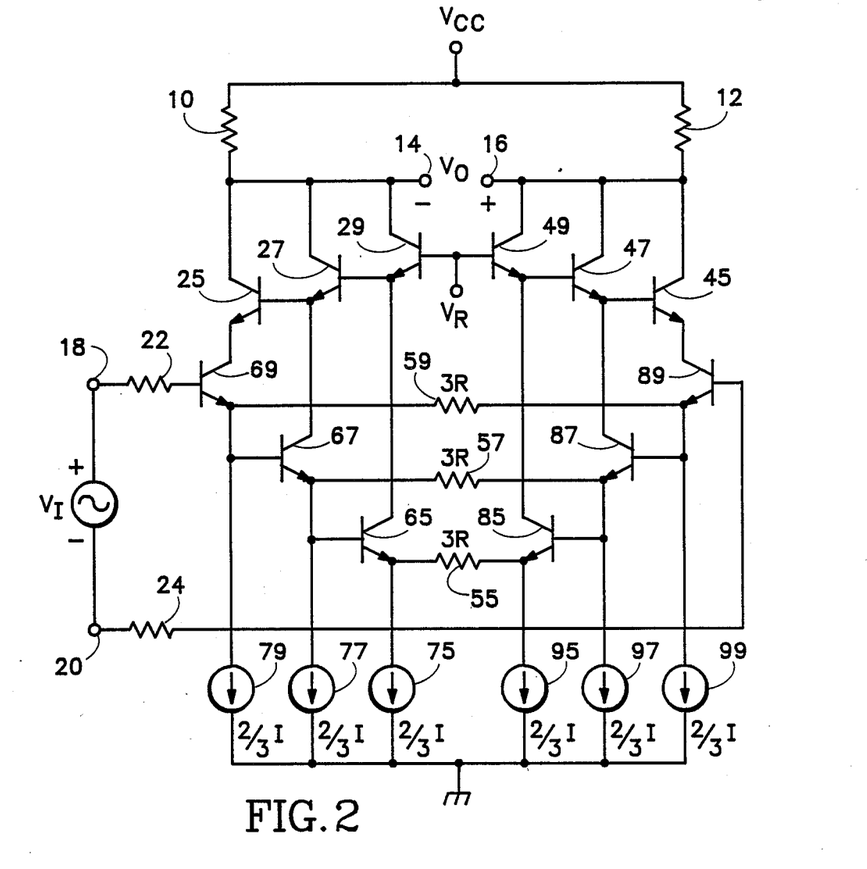
FIG. 2 is a schematic diagram of an alternative first embodiment of a differential amplifier according to the present invention.
Figure 3D:
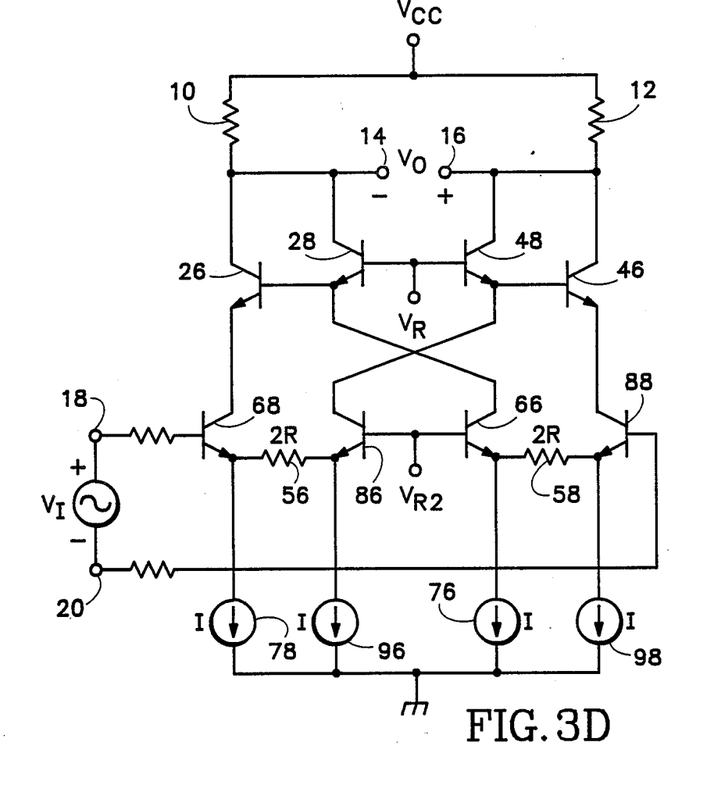
FIG. 3D is a schematic diagram of a second embodiment of an $f_T$ doubler amplifier according to the present invention.

To understand why the configuration of FIGS. 1D, 2, and 3D produce a pulse response having reduced phase distortion, the paths of the collector and base currents are analyzed. Due to the symmetry of the circuits, only one half of each circuit need be analyzed.

The response of transistor collector current is greatly affected by parasitic base resistance charging the collector-base Miller capacitance. Note that the base of transistor 23 is directly coupled to a DC voltage, $V_R$, while the base of transistor 21 is coupled through transistor 23 to the same voltage. The corresponding voltage changes at the emitters of transistors 21 and 23 result in more Miller capacitance at the collector of transistor 63 and relatively less at the collector of transistor 61. However, transistor 63 is directly coupled to the input voltage, while the response of transistor 61 is delayed since it is coupled through transistor 63 to the input voltage. Therefore it can be seen that the "fast" response of transistor 63 is delayed by the increased Miller capacitance at the emitter of transistor 21, while the "slow" response of transistor 61 is delayed to a lesser extent by the lower Miller capacitance at the emitter of transistor 23. The delay through the two current paths are more closely matched and the current contributions are finally summed at output terminal 14.

The recovery of base current is also important to reducing phase distortion. If base current is significantly delayed and summed with the other current contributions, phase distortion such as overshoot is the result. Delayed base current also reduces rise time. As mentioned earlier in the analysis of FIG. 1B, the Darlington common base stage is used to reduce base current losses. The base current that is recovered is that of transistor 21. In FIG. 1D the base current is produced without the delay through the emitter of transistor 63 as it is in FIG. 1C. Thus, the recovered base current arrives earlier at the output terminal 14, which improves rise time and reduces phase distortion.

FIG. 2 is an alternative first embodiment of the invention, and an extension of the circuit shown in FIG. 1D. This circuit is designated as an "$f_T$ tripler". Transistors 69 and 89, transistors 67 and 87, and transistors 65 and 85 form a series of cascaded differential amplifier stages. The emitters of the transistors in each stage are coupled through emitter resistors 59, 57, and 55, respectively. Each emitter resistor has a value of 3R ohms. The emitters of each stage are coupled to a pair of constant current sources, 79 and 99, 77 and 97, and 75 and 95, respectively. Each current source has a value of 2/3I milliamps. A Darlington common base stage is shown having a pair of three transistors, 29 and 49, 27 and 47, and 25 and 45. The emitters of one transistor are coupled to the base of the next transistor to form a series of coupled transistors. The base of the first transistor in each pair, 29 and 49, is coupled to a constant reference voltage, $V_R$.

Note that the emitters from the first transistor in each pair, 29 and 49, are coupled to the output from the last differential amplifier stage, transistors 65 and 85, and the emitters from the second transistor in each pair, 27 and 47, are coupled to the output from the next-to-last differential amplifier stage, transistors 67 and 87. This coupling is repeated and the emitters from the last transistor in each pair, 25 and 45, are coupled to the output from the first amplifier stage, transistors 69 and 89. The collectors of each pair of transistors in the common base stage are respectively coupled together to form a differential output current, which is transformed into a differential output voltage at output terminals 14 and 16 by load resistors 10 and 12.

The analysis of the delay of the collector and base currents is similar to the analysis for the circuit of FIG. 1D. That is to say the "fastest" collector currents are passed through the "slowest" paths to provide greater matching in the delays resulting in lower phase distortion and improved risetime. Similarly, the recovered base currents are summed with improved delay matching.

It is apparent that the progression from the $f_T$ doubler in FIG. 1D to the $f_T$ tripler in FIG. 2 may be extended to four or even more stages. As more amplifier stages are added, another pair of transistors is added to the Darlington common base stage. However, the sequence of coupling the emitters of the Darlington common base stage to the outputs of the amplifier stages must be maintained.

The second embodiment of the present invention is shown in FIG. 3D. The amplifier stage has been described in the Background of the invention and is shown in FIG. 3C. Here again, the important difference lies in the configuration of the common base stage. Note that the location of the inner and outer transistors in the common base stage have been reversed. Specifically, transistors 26 and 28 have switched positions with the emitter of transistor 26 now being coupled to the collector of transistor 68 and the emitter of transistor 28 now being coupled to the collector of transistor 66. Similarly, transistors 46 and 48 have switched positions with the emitter of transistor 46 now being coupled to the collector of transistor 88 and the emitter of transistor 48 now being coupled to the collector of transistor 86.

The analysis of the improvement in risetime and reduction in phase distortion due to matching of delays in the collector and base current components proceeds in a similar fashion as the analysis for the first embodiment of the invention shown in FIG. 1D.

While I have shown and described preferred embodiments of the invention, it is apparent to those skilled in the art that many changes and modifications may be made without departing from the invention in its broader aspects. For example, the circuits of FIGS. 1D, 2, and 3D may be constructed of PNP transistors with an appropriate change in polarity of bias voltages and currents. It is therefore intended that the appended claims cover all such changes and modifications as fall within the true spirit and scope of the invention.

I claim:

1. An $f_T$ doubler amplifier comprising:
  (a) an $f_T$ doubler stage having an input for receiving a differential input voltage, a pair of inner collectors for providing a first differential current and a pair of outer collectors for providing a second differential current; and
  (b) a Darlington common base stage having a pair of inner emitters for receiving the second differential current, a pair of outer emitters for receiving the first differential current, and an output for providing a differential output current.

2. An $f_T$ doubler amplifier as in claim 1 wherein the $f_T$ doubler stage is of the Darlington type, and
  the pair of outer collectors are coupled to the pair of inner emitters of the Darlington common base stage and the pair of inner collectors are coupled to the pair of outer emitters of the Darlington common base stage.

3. An $f_T$ doubler amplifier as in claim 1 wherein the $f_T$ doubler stage is of the series input-parallel output type, and
  the pair of outer collectors are coupled to the pair of inner emitters of the Darlington common base stage and the pair of inner collectors are cross-coupled to the pair of outer emitters of the Darlington common base stage.

4. An $f_T$ doubler amplifier as in claim 1 further comprising a pair of load resistors for receiving the differential output current to form a differential output voltage.

5. A differential amplifier comprising:
  (a) N differential amplifier stages each having an input, an output, and a pair of emitter terminals coupled to a pair of constant current sources, the emitter terminals of one stage being coupled to the inputs of another amplifier stage to form a series of cascaded amplifier stages, the input to the first amplifier stage receiving a differential input voltage, wherein N is an integer greater than two; and (b) a Darlington common base stage having a pair of N transistors each having a base, an emitter, and a collector, the emitters of one transistor being coupled to the base of another transistor to form a series of coupled transistors, the base of the first transistor in each pair being coupled to a constant reference voltage, the emitters from the first transistor in each pair being coupled to the output from the last differential amplifier stage, the emitters from the second transistor in each pair being coupled to the output from the next-to-last differential amplifier stage, the coupling being repeated in sequence until the emitters from the last transistor in each pair are coupled to the output from the first amplifier stage, the collectors of each pair of N transistors being respectively coupled together to form a differential output current.

6. An differential amplifier as in claim 5 further comprising a pair of load resistors for receiving the differential output current to form a differential output voltage.

* * * * *